United States Patent
Dooper et al.

(10) Patent No.: US 8,861,748 B2
(45) Date of Patent: Oct. 14, 2014

(54) AMPLIFIER AND AMPLIFIER CONTROL METHOD

(75) Inventors: Lutsen Ludgerus Albertus Hendrikus Dooper, Brummen (NL); Marco Berkhout, Tiel (NL); Wilfred Repko, Hilversum (NL)

(73) Assignee: NXP B.V., Eindhoven (NL)

( * ) Notice: Subject to any disclaimer, the term of this patent is extended or adjusted under 35 U.S.C. 154(b) by 401 days.

(21) Appl. No.: 13/303,007

(22) Filed: Nov. 22, 2011

(65) Prior Publication Data

US 2012/0134514 A1 May 31, 2012

(30) Foreign Application Priority Data

Nov. 26, 2010 (EP) .................................... 10192805

(51) Int. Cl.
*H03F 99/00* (2009.01)
*H03F 3/217* (2006.01)
*H03F 3/68* (2006.01)

(52) U.S. Cl.
CPC .................................... *H03F 3/2178* (2013.01)
USPC ............................ 381/120; 330/251; 330/295

(58) Field of Classification Search
CPC ...................................................... H03F 3/217
USPC ................... 381/120, 71.1–71.12, 94.1–94.9; 330/251, 295
See application file for complete search history.

(56) References Cited

U.S. PATENT DOCUMENTS

| 4,764,734 | A | 8/1988 | Schilling et al. |
| 5,422,597 | A | 6/1995 | Stengel et al. |
| 5,929,702 | A | 7/1999 | Myers et al. |
| 8,212,612 | B2 * | 7/2012 | Song et al. ........................ 330/10 |
| 2010/0052792 | A1 * | 3/2010 | Nose et al. ..................... 330/295 |
| 2010/0079186 | A1 | 4/2010 | Zannoth et al. |
| 2010/0289578 | A1 | 11/2010 | Cao |

FOREIGN PATENT DOCUMENTS

| EP | 2 063 531 A1 | 5/2009 |
| WO | 2008/105592 A1 | 9/2008 |

OTHER PUBLICATIONS

Muggler, P. et al. "A Filter Free Class D Audio Amplifier with 86 Power Efficiency", Proc. Int'l Circuits and Systems, vol. 1, pp. 1036-1039 (May 2004).

Extended European Search Report for Patent Appln. No. 10192805.9 (May 6, 2011).

* cited by examiner

*Primary Examiner* — Vivian Chin
*Assistant Examiner* — Ammar Hamid

(57) ABSTRACT

Disclosed is a class D amplifier comprising a modulation stage having a first input for receiving an input signal and an output for producing a modulated version of the input signal; a plurality of power stages, each power stage being responsive to said modulation stage and comprising a first switch and a second switch coupled in series between a first voltage source and a second voltage source, each power stage comprising an output node between the first switch and the second switch; and a power stage control circuit for measuring the input signal level and enabling a selected number of the power stages as a function of the measured input signal level. A method for controlling such a class D amplifier is also disclosed.

13 Claims, 4 Drawing Sheets

AMPLIFIER AND AMPLIFIER CONTROL METHOD

Figure 1:
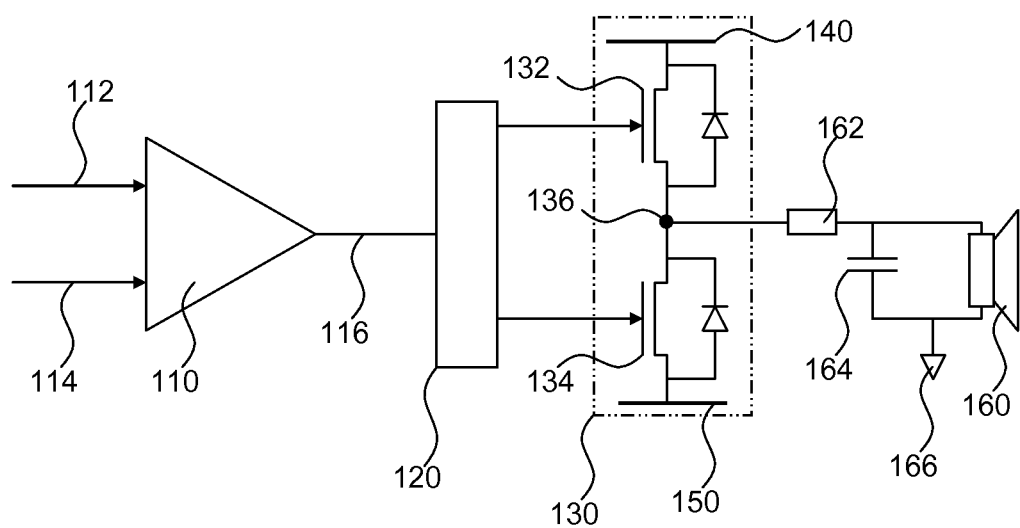

This application claims the priority under 35 U.S.C. §119 of European patent application no. 10192805.9, filed on Nov. 26, 2010, the contents of which are incorporated by reference herein.

FIELD OF THE INVENTION

The present invention relates to an amplifier, in particular a class D amplifier, comprising a modulation stage having a first input for receiving an input signal and an output for producing a modulated version of the input signal and a power stage responsive to said comparator and comprising a first transistor and a second transistor and coupled in series between a first voltage source and a second voltage source, said power stage comprising an output at a node between the first transistor and the second transistor.

The present invention further relates to a method of controlling such an amplifier.

BACKGROUND OF THE INVENTION

Class D amplifiers, which are sometimes also referred to as switching amplifiers typically use two serially connected power transistors such that the first of the power transistors switches the output to the positive voltage supply whereas the second of the power transistors switches the output to the negative voltage supply. The power transistors are typically controlled by a pulse width modulated version of the audio input signal. Class D amplifiers are interesting devices in low-power applications because of their high efficiency compared to traditionally used linear AB-class amplifiers.

A previous drawback of class D amplifiers was that in order to extract the output signal from the amplified modulated signal, a relatively bulky low pass output filter was required, thus for instance limiting the applicability of class D amplifiers in compact designs. However, P. Muggler et al. disclosed in Proc. Int. Symp. Circuits and Systems, Vol. 1, May 2004, pages 1036-1039 that such a filter could be omitted from the design of the class D amplifier by the use of a bridge-tied load configuration in combination with 3-level pulse width modulation (PWM) scheme, and using the low-pass behavior of the magnetic speaker as the filter.

Consequently, class D amplifiers have gained considerable interest as low-power loudspeaker drivers in for instance mobile communication applications as they have a far better power efficiency than traditionally used class AB amplifiers.

Nevertheless, design challenges still have to be overcome to ensure that a class D amplifier operates as efficiently as possible. In order to optimize signal amplification, the on-resistance ($R_{on}$) of the power transistors has to be minimized. This can be achieved by increasing the size of the power transistor. However, the consequence of such a size increase is that the idle dissipation of the power transistor stage is increased, thereby reducing the efficiency of the class D amplifier and reducing battery life if the amplifier is battery-powered. The charge and discharge current of the power transistor gates forms a large portion of this dissipation, and scales with the size of the power transistor. Consequently, one of the main design challenges in class D amplifier design is to find a suitable trade-off between maximum audio output power and maximum idle dissipation.

SUMMARY OF THE INVENTION

The present invention seeks to provide a class D amplifier in which finding the trade-off between maximum audio output power and maximum idle dissipation can be automatically controlled.

The present invention further seeks to provide a method for automatically controlling the trade-off between maximum audio output power and maximum idle dissipation for a class D amplifier.

According to an aspect of the present invention, there is provided an amplifier comprising modulation stage having an input for receiving an input signal, and an output for providing a modulated version of the input signal; a plurality of power stages, each power stage being responsive to said modulation stage and comprising a first switch and a second switch coupled in series between a first voltage source and a second voltage source, each power stage comprising an output node between the first switch and the second switch; and a power stage control circuit for measuring the input signal level and enabling a selected number of the power stages as a function of the measured input signal level.

Hence, in accordance with the present invention, the size of the amplification stage is dynamically matched to the strength of the input signal, such that the signal amplification factor is always as close to optimal as possible. Consequently, the amount of idle dissipation is minimized as the size of the power stage is never (substantially) larger than necessary for the strength of the input signal.

In an embodiment, the modulation stage comprises a comparator, said comparator further comprising a second input for receiving a modulated reference signal.

In a preferred embodiment, the power stage control circuit comprises a signal level generator for holding a measured maximum value of the input signal level, said signal level generator being arranged to produce a decaying output signal having a predefined decay as a function of the measured maximum value of the input signal level when the input signal level drops below said measured maximum value. This has the advantage that for a rapidly weakening input signal, e.g. a signal that switches off, a delay is introduced in the disabling of the power stages, such that a phase mismatch between the output current and the output voltage of the stage does not lead to problems such as large currents still flowing through the power stage at the point in time the power stage is disabled.

In a further embodiment, the power stage control circuit further comprises a plurality of comparison stages, each having first input for receiving the output signal of the signal hold element and a second input for receiving a different fraction of a further reference signal, each of said comparison stages producing an output signal for controlling a unique subset of the plurality of power stages. This is a straightforward implementation; for instance, for 2N power stages, N reference signal fraction levels (1/N, 2/N . . . , 1) may be defined that each are used to activate a subset of the power stages when the output signal of the signal hold element exceeds the relevant reference signal level.

Alternatively, one of the power stages is permanently enabled. This is a simplification of the previous embodiment, which has been based on the insight that for certain designs, a single amplification stage is always required.

The amplifier may further comprise a loudspeaker connected to the respective outputs of the power stages. The low pass characteristics of the loudspeaker may be used to eliminate a low pass filter from the design of the amplifier.

The amplifier may be integrated in any suitable electronic device. Particularly suitable are battery-powered mobile communication devices, as the dynamic power stage dimensioning arrangement of the amplifier of the present invention ensures that battery power of the mobile communication device is improved, thereby improving its marketability. Examples of such mobile communication devices include mobile phones, PDAs, handheld computers, netbooks, laptops and so on.

In accordance with another aspect of the present invention, there is provided a method of controlling an amplifier comprising a modulation stage having a first input for receiving an input signal and an output for producing a modulated version of the input signal; a plurality of power stages, each power stage being responsive to said modulation stage and comprising a first switch and a second switch and coupled in series between a first voltage source and a second voltage source, each power stage comprising an output node between the first switch and the second switch, the method comprising measuring the input signal level; and enabling a selected number of the power stages as a function of the measured input signal level.

Such a method allows for the operation of an amplifier, in particular a class D amplifier, in a more power-efficient manner as idle dissipation is minimized.

In an embodiment, the method further comprises producing a signal strength indication signal, said producing step comprising producing the input signal as the signal strength indication signal for an input signal increasing in strength; holding the maximum value of said increasing input signal level; and producing a decaying signal strength indication signal having a predefined decay as a function of the measured maximum value of the input signal level for the input signal level decreasing in intensity. This avoids premature disabling of power stages as previously explained.

In a further embodiment, the method further comprises comparing the signal strength indication signal with a plurality of different fractions of a reference signal, each comparison result providing an enable signal for a different subset of power stages. This has the advantage that this power stage selection step is easy to implement.

BRIEF DESCRIPTION OF THE EMBODIMENTS

Figure 2:
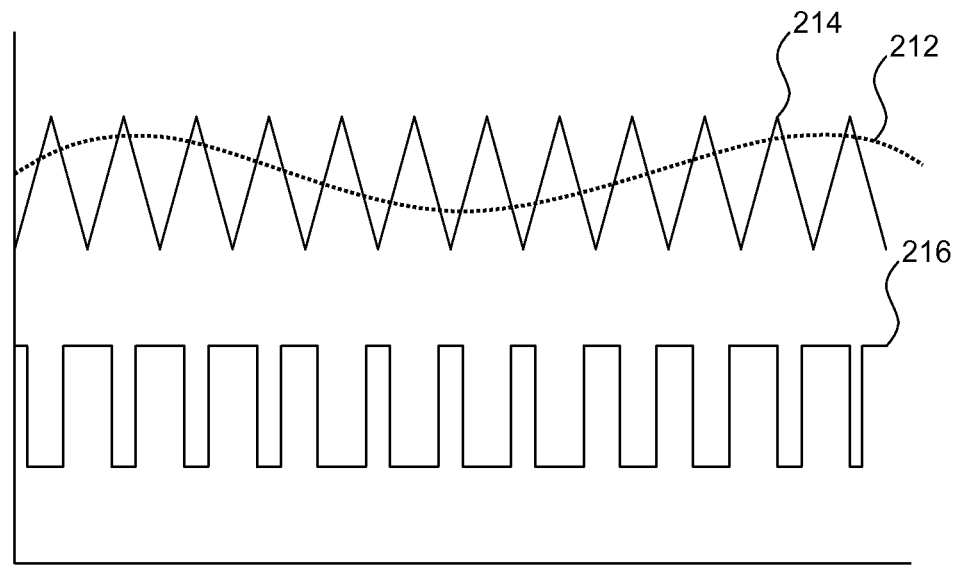
Figure 3:
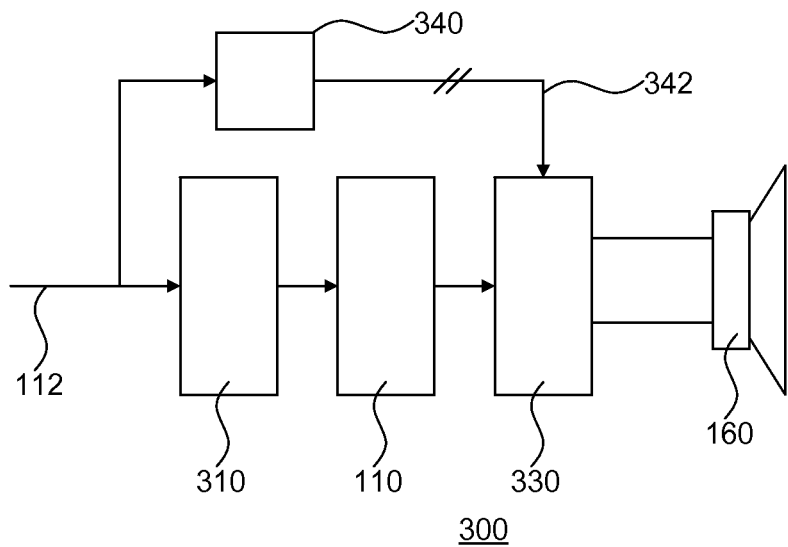
Figure 4:
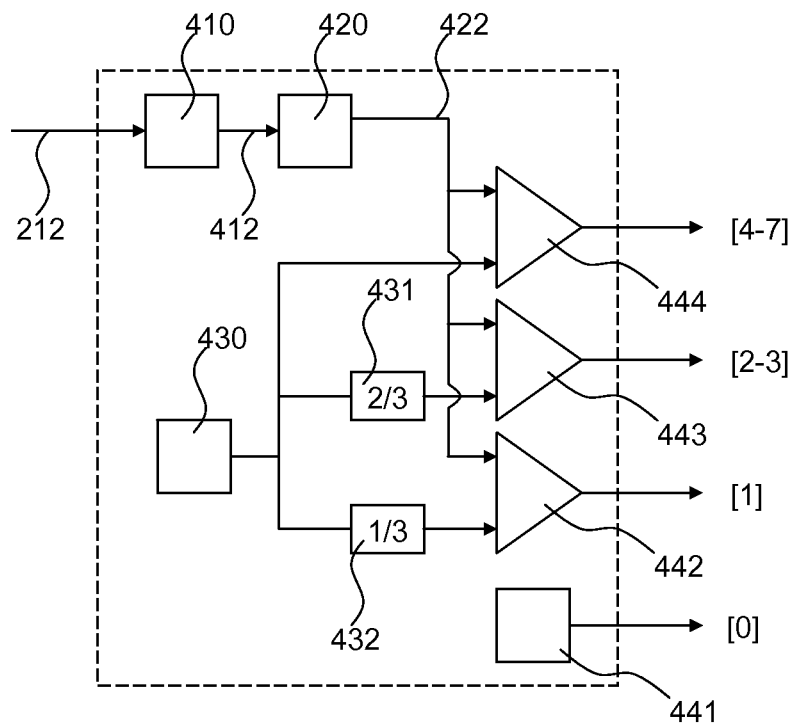
Figure 5:
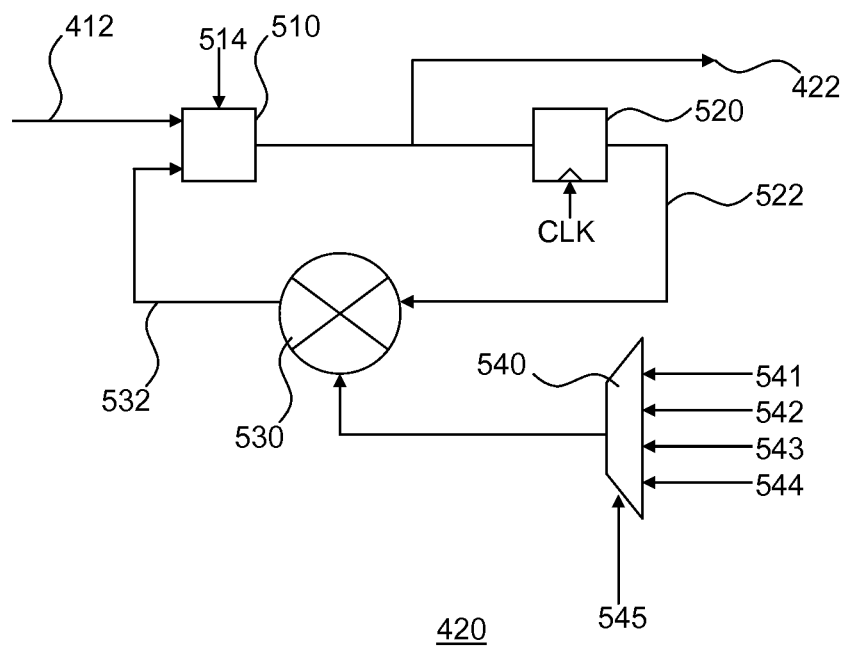
Figure 6:
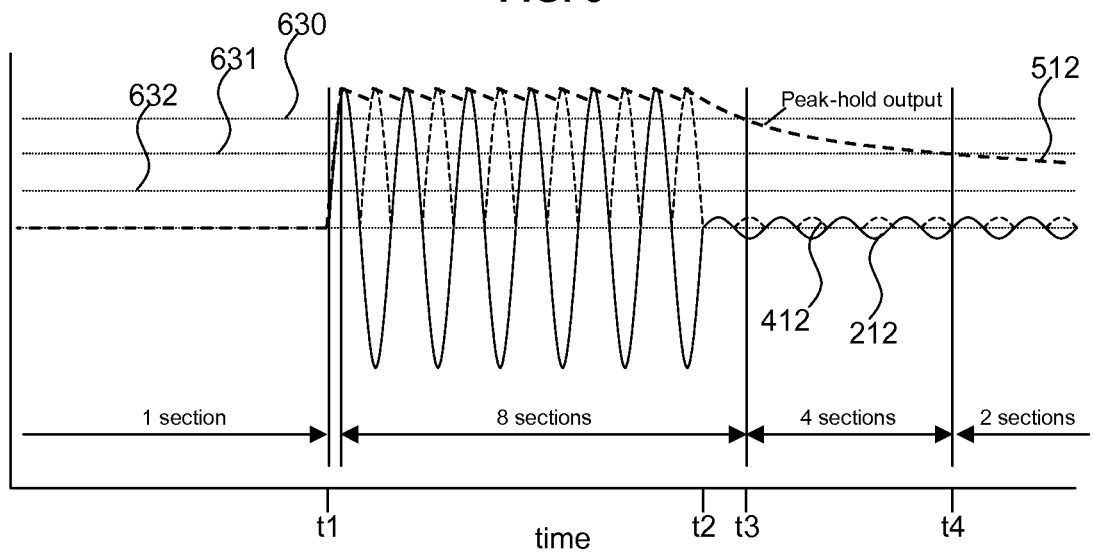
Figure 7:
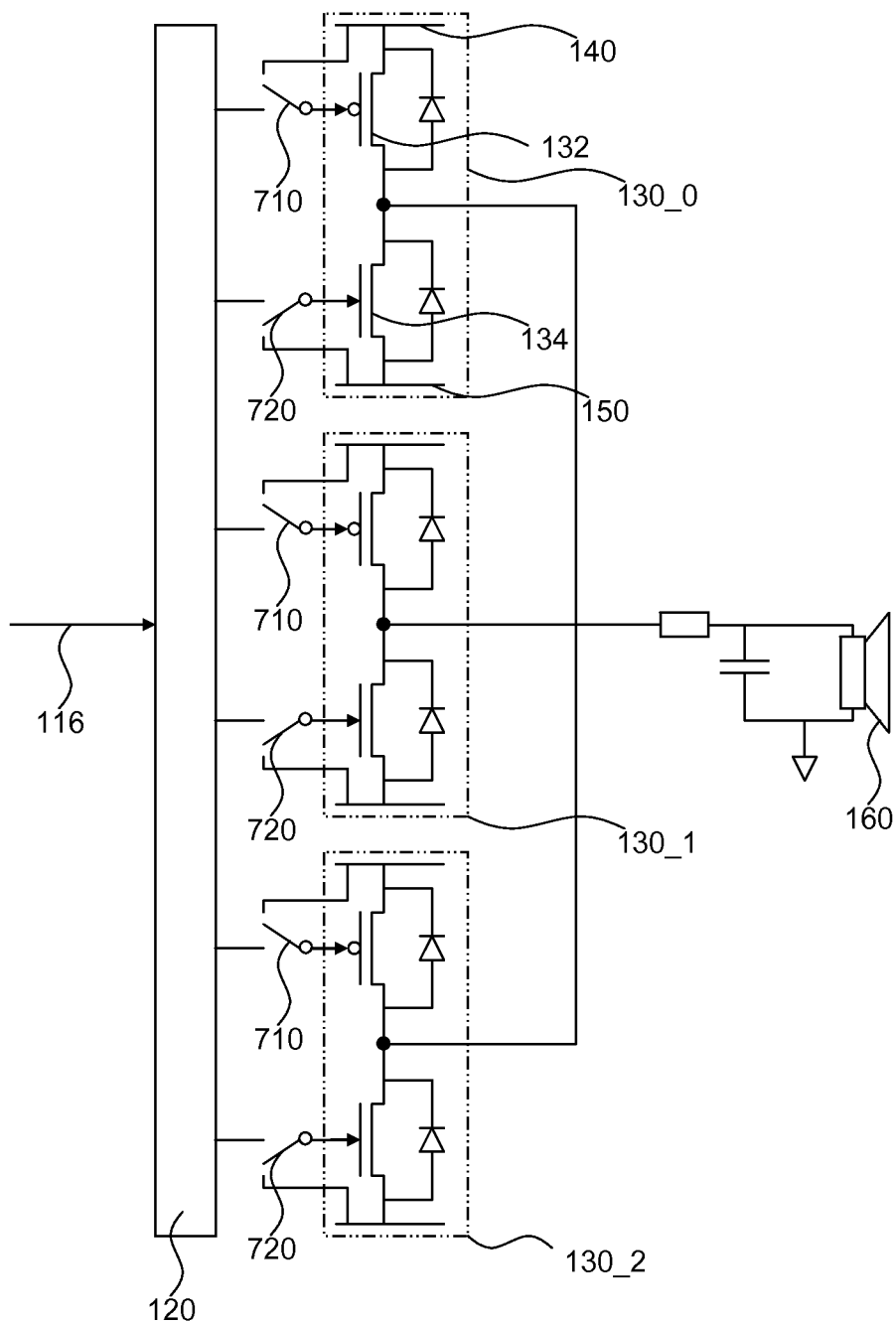

Embodiments of the invention are described in more detail and by way of non-limiting examples with reference to the accompanying drawings, wherein FIG. 1 schematically depicts a prior art class D amplifier;

FIG. 2 schematically depicts the operating principle of a class D amplifier;

FIG. 3 schematically depicts an embodiment of a class D amplifier of the present invention;

FIG. 4 schematically depicts an aspect of a class D amplifier according to an embodiment of the present invention;

FIG. 5 schematically depicts another aspect of a class D amplifier according to an embodiment of the present invention;

FIG. 6 schematically depicts a control signal for a class D amplifier according to an embodiment of the present invention; and FIG. 7 schematically depicts yet another aspect of a class D amplifier according to an embodiment of the present invention;

DETAILED DESCRIPTION OF THE DRAWINGS

It should be understood that the Figures are merely schematic and are not drawn to scale. It should also be understood that the same reference numerals are used throughout the Figures to indicate the same or similar parts.

FIG. 1 schematically depicts a known architecture of a class D amplifier 100. The amplifier 100 comprises a comparator 110 having an input 112 for receiving an analog input signal 212 and a reference modulating signal 214 on its input 114. The comparator 110 provides the resulting pulse width modulated input signal 216 on its output 116. The operation of the comparator 110 is shown in more detail in FIG. 2; the analog input signal 212 and periodic reference signal 214 are continuously compared by the comparator 110, thereby yielding the pulse width modulated version 216 of the input signal 212.

The pulse width modulated input signal 216 is forwarded to a driver stage 120, which is used to provide the control signals for the power switches 132 and 134 in the power stage 130. The power switches may be of any suitable type, e.g. CMOS or bipolar transistors, e.g. BiCMOS transistors. Each of the power switches 132 and 134 comprise a back-gate diode between its source and drain as shown in FIG. 1. The power switches 132 and 134 are connected in series between a positive voltage supply 140 and a negative voltage supply 150, e.g. between supply voltage and ground. A node 136 is located in the current path in between the power switches 132 and 134, which produces the output signal of the power stage 130. The output signal of the power stage 130 is an amplified version of the pulse width modulated input signal 216.

The output signal of the power stage 130 is forwarded to a loudspeaker 160. The low pass characteristics of the loudspeaker 160 ensure that the amplified version of the pulse width modulated input signal 216 is converted to an amplified version of the analog input signal 212. The signal path from the output 136 to the loudspeaker 160 may further comprise signal shaping components such as a resistor 162 and a capacitor 164, which may have one of its plates connected to the aforementioned signal path and the other of its plates connected to ground 166.

It should be understood that many other architectures of a class D amplifier 100 are feasible. For instance, the amplifier may have a bridge tied load configuration (also known as a H-bridge output configuration) as for instance disclosed in the previously mentioned paper by Muggier et al, which also obviates the need for a separate low pass filter. It is reiterated that for a filterless design of the class D amplifier, a 3-level modulation signal 214 is preferably used. The characteristics of such a modulation signal are disclosed in detail in the previously mentioned paper by Muggier et al. Alternatively, a low pass filter may be included between the output 136 and the loudspeaker 160 to extract the amplified input signal 212 from the amplified version of the pulse width modulated input signal 216.

Furthermore, the modulation of the input signal in a class D amplifier is not limited to analog input signals. Pulse width modulation can be equally applied to digital signals, e.g. bit streams. In addition, other types of modulation can be used; for instance, pulse density modulation (PDM) can also be applied to the input signal to generate a drive signal for the switch driving stage 120.

A problem with the architecture of class D amplifiers such as shown in FIG. 1 is that the level of amplification provided by the power stage 130 has been designed based on maximum amplification requirements. The consequence of this is that in case less than the maximum output signal strength is required, the power stage 130 essentially is oversized. This has the drawback that during idle periods, the idle dissipation of the power stage 130 is negatively affected, i.e. is larger than desired.

This problem has been addressed by the present invention in the following manner. As shown in FIG. 3, a class D amplifier 300 according to an embodiment of the present invention comprises a digital to analog converter 310 for converting a digital version of the input signal 212 received on the input 112 into an analog version thereof. Obviously, the digital to analog converter 310 may be omitted in case the input signal 212 is already in an analog form or if the digital input signal is to be modulated. The amplifier 300 further comprises a modulation stage 110, which may implement any suitable type of modulation. In an embodiment, the modulation stage 110 comprises a comparator, in which the analog input signal 212 is modulated with a reference signal 214 (not shown) to provide a pulse width modulated version 216 of the input signal 212 as shown in FIG. 2.

The modulated input signal 216, e.g. a PWM input signal, is forwarded to a modified power stage 330, which includes the switch driver 120 and a plurality of power switch stages 130 (not shown). This will be shown in more detail later. The class D amplifier 300 further comprises a power stage enable circuit 340, which produces one or more control signals 342 as a function of the signal strength of the audio input signal 112. The one or more control signals 342 are used as enable signals for respective subsets of the power switch stages 130.

This is shown in more detail with the aid of FIG. 4. Power stage control circuit 340 comprises a rectifier circuit 410, which produces a rectified version 412 of the audio input signal 212. The rectified input signal 412 is forwarded to a signal level generator 420, which will be explained in more detail below. The output of the signal strength generator 420 is forwarded to a plurality of comparison circuits 442-444, each of which are arranged to produce an enable signal for a different subset of power switch stages 130.

The power stage control circuit 340 further comprises a reference signal generator 430, which is arranged to produce a reference signal of predetermined signal strength. Different fractions of this reference signal strength are provided to the respective comparison stages 442-444. In FIG. 4, the comparison stage 444 is provided with the full strength of this reference signal, the comparison stage 443 is provided with ⅔ of the full strength of this reference signal and the comparison stage 442 is provided with ⅓ of the full strength of this reference signal. This may for instance be achieved by the inclusion of signal dividers 431 and 432, e.g. resistors, in the signal paths from the reference signal generator 430 to the comparison stages 443 and 442 respectively.

In FIG. 4, power stage control circuit 340 is configured to provide enable signals to eight different power switch stages 130. A constant enable signal generator 441 provides a permanent enable signal to a power switch stage labeled [0] in FIG. 4. The comparison stage 442 provides an enable signal to a single power switch stage labeled [1]. The comparison stage 443 provides an enable signal to a pair of power switch stages labeled [2-3]. The comparison stage 444 provides an enable signal to four power switch stages labeled [4-7].

In operation, one of the power switch stages 130 (i.e. the power switch stage labeled [0]) is always switched on, whereas the remaining power switch stages 130 are only enabled when the strength of the signal generated by the signal strength generator 420 exceeds the strength of the fraction of the reference signal received by the comparison stage responsible for generating the enable signal for the corresponding power switch stage.

It should be understood that the implementation of the power stage control circuit 340 in FIG. 4 is shown by way of non-limiting example only. In FIG. 4, the number of comparison stages is chosen by way of the formula $2^N$, in which $2^N$ is the number of power switch stages 130 and N is a positive integer representing the number of comparison stages, with the $n^{th}$ comparison stage providing an enable signal for $2^n$ power switch stages 130, in which $0 \leq n < N$ (n is an integer). In FIG. 4, N=3 by way of non-limiting example. It should be understood that the class D amplifier 300 may have any suitable number of power switch stages 130 and any suitable number of comparison stages in the power stage control circuit 340. Similarly, it is not necessary to design the power stage control circuit 340 in such a manner that the number of enable signals generated by each comparison stage 442-444 equals a power of 2.

FIG. 5 schematically depicts an example embodiment of the signal level generator 420 in more detail. In operation, the signal level generator 420 is arranged to follow the strength of the rectified input signal 412 as long as the strength of the rectified input signal 412 is non-decreasing. For a decreasing strength input signal 412, the output signal of the signal level generator 420 preferably decays in a predefined manner, such as by decreasing with a negative exponential function rather than following the rectified input signal 412. The predefined decay function is particularly advantageous when the output current of the power stage 330 can be out of phase with its output voltage. In such a scenario, a decay function such as a negative exponential function prevents that power switch stages 130 are abruptly switched off while large current still flows through the stage. Consequently, the use of such a decay function prevents degradation of the quality of the output signal produced by the power stage 330 caused by unwanted switching events.

In order to implement a suitable decay function, the signal level generator 420 may comprise a comparator stage 510, which is adapted to compare the incoming rectified input signal 412 with an internally generated correlation signal 532. The largest signal of the two input signals is forwarded to the output of 510. The result signal 422 is forwarded to the comparison stages 442-444 as previously explained. In addition, the result signal 422 is periodically stored in a memory element 520, e.g. a latch or flip-flop controlled by a clock signal CLK. A decay generator, e.g. a mixer 530 is provided to produce the correlation signal 532 from the signal 522 provided by the memory element 520 and a control signal received from a multiplexer 540 comprising a way of non-limiting example four inputs 541-544 and a control terminal 545. The mixer 530 is arranged to multiply output signal 512 obtained from the memory element 520 with a scaling factor having a value smaller than 1 but larger than 0.

Different scaling factors may be defined on the different inputs of the multiplexer 540 to implement different decay characteristics. Consequently, the loop formed by the memory element 520 and the mixer 530 decreases the signal 522 with a negative exponential function as long as signal 532 is larger than input signal 412.

It should however be understood that other types of decay functions having predefined decays such as time delays, linear decay functions or hysteresis-based decay functions are equally applicable. Other suitable decay functions will be apparent to the skilled person. In the context of the present invention, a decay function is to include a function in which the decreasing input signal 412 is simply reproduced by the decay stage 430 with a delay large enough to eliminate the effect of any phase differences between the voltage and current domains of the power switch stages 130.

The various operational modes of a class D amplifier 300 according to an embodiment of the present invention having eight power switch stages 130 is explained in more detail with the aid of FIG. 6. Reference signal level 630 is the reference signal level at the output of reference signal generator 430, reference signal level 631 is the reference signal level at the output of the signal divider 431 and reference signal level 632 is the reference signal level at the output of the signal divider 432. As can be seen in FIG. 6, during an initial period the rectified input signal 412 has a zero value. In other words, the strength (amplitude) of the rectified input signal 412 is smaller than the strength (level) of any other reference signals 630-632, such that none of the comparison stages 442-444 produced an enable signal. Consequently, only the permanently enabled power switch stage labeled [0] in FIG. 4 is switched on.

At point in time t1, the strength of the rectified input signal 412 rapidly increases to above the level of the reference signals 630-632. As explained with the aid of FIG. 5, the output signal 422 of the signal level generator 420 follows this increase without delay. In the time interval t1-t2, the rectified input signal 412 oscillates between a maximum value above the level of the reference signals 630-632 and the minimum value below the level of the reference signals 630-632. However, the oscillation frequency is such that the decay of the output signal 422 never drops below the level of the reference signal 630 such that at all times during the time interval t1-t2 all comparison stages 442-444 keep producing an enable signal such that all power switch stages 130 labeled [0]-[7] in FIG. 4 are permanently enabled during this interval.

At t2, the intensity of the input signal 212 and its rectified version 412 drops to a significantly lower level such that the maximum amplitude of the signals remains below the level of reference signal 632. However, due to the delayed decay of the output signal 422 of the signal level generator 420, this does not lead to the immediate disabling of the power switch stages 130. Instead, the decaying output signal 422 crosses the level of reference signal 630 at t3, thus resulting in the delayed disabling of power switch stages 130 labeled [4-7] in FIG. 4 due to the fact that comparison stage 444 stops producing the enable signal at this point in time. At t4, the decaying output signal 422 crosses the level of reference signal 631, thus resulting in the delayed disabling of power switch stages 130 labeled [2-3] in FIG. 4 due to the fact that comparison stage 443 stops producing the enable signal at this point in time.

FIG. 7 schematically depicts an example embodiment of the power stage 330 in the class D amplifier 300 of the present invention. The power stage 330 has a switch driver 120 responsive to a pulse width modulated version 216 of the input signal 212 received from the output 116 of the pulse width modulation stage 110. The power stage 330 as a plurality of sub stages 130 (i.e. previously referred to as power switch stages). In FIG. 7, three such sub stages are shown by way of non-limiting example only. The control terminals (e.g. gates) of the power switches, e.g. a pMOS power transistor 132 and an nMOS power transistor 134, in each of the sub stages 130_0, 130_1 and 130_2 are connected to the switch driver 120 via respective enable switches 710 and 720, in which the enable switches 710 and 720 of each of the sub stages 130 may be controlled by a different enable signal from the power stage control circuit 340, e.g. enable signals generated by different ones of the comparators 442-444 and/or the enable signal generator 441. The enable switches 710 and 720 of some of the sub stages may share the same enable signal as previously explained. In case of enable switches 710 and 720 of one of the sub stages 130 being controlled by enable signal generator 441, i.e. may be permanently enabled, the enable switches 710 and 720 of this sub stage may be omitted for this reason in an alternative embodiment. In an embodiment, the enable switch 710 is arranged to switch the pMOS power transistor 132 between the positive voltage supply terminal 140 and the switch driver 120, whereas the enable switch 720 is arranged to switch the nMOS power transistor 134 between the negative voltage supply terminal 150 and the switch driver 120 as shown in FIG. 7. This ensures that the power switches 132 and 134 are effectively switched off when their control terminals (e.g. gates) are connected to these voltage supply terminals.

It should however be understood that alternative arrangements for selectively enabling one or more of the sub stages 130 are equally feasible. For instance, the switch driver 120 may be adapted to receive the enable signals from the comparison stages 442-444 to selectively generate the control signals for the appropriate sub stages 130, i.e. switch the control terminals of the appropriate pMOS transistors 132 to the positive supply voltage source 140 and switch the control terminals of the appropriate nMOS transistors 134 to the negative supply voltage source 150. In other words, the functionality of the switches 710 and 720 may be integrated into the switch driver 120 in any suitable manner, for instance such that separate switches 710 and 720 may be omitted. Alternatively, the sub stages 130 may be formed in separate power domains, with power to a sub stage only be delivered in the presence of an enable signal generated by the corresponding comparison stage of the power stage control circuit 340.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An amplifier comprising:
   a modulation stage having an input configured to receive an input signal, and an output configured to provide a modulated version of the input signal;
   a plurality of power stages, each power stage being responsive to said modulation stage and comprising a first switch and a second switch coupled in series between a first voltage source and a second voltage source, each power stage comprising an output node between the first switch and the second switch; and
   a power stage control circuit configured to compare the input signal level to fractions of a reference signal, wherein each respective fraction corresponds to a different power stage, and enable a selected number of the power stages as a function of the measured input signal level.

2. The amplifier of claim 1, wherein the modulation stage further comprises:
   a comparator, said comparator further comprising a second input configured to receive a modulated reference signal.

3. The amplifier of claim 1, wherein said plurality is a power of 2.

4. An amplifier comprising:
- a modulation stage having an input configured to receive an input signal, and an output configured to provide a modulated version of the input signal;
- a plurality of power stages, each power stage being responsive to said modulation stage and comprising a first switch and a second switch coupled in series between a first voltage source and a second voltage source, each power stage comprising an output node between the first switch and the second switch; and
- a power stage control circuit configured to measure the input signal level and enable a selected number of the power stages as a function of the measured input signal level, wherein the power stage control circuit comprise a signal level generator configured to hold a measured maximum value of the input signal level and produce a decaying output signal having a predefined decay as a function of the measured maximum value of the input signal level when the input signal level drops below said measured maximum value.

5. The amplifier of claim 4, wherein the power stage control circuit further comprises:
- a plurality of comparison stages, each comparison stage having a first input configured to receive the output signal of the signal level generator and a second input configured to receive a different fraction of a further reference signal, each of said comparison stages configured to produce an output signal that enables a unique subset of the plurality of power stages.

6. The amplifier of claim 5, wherein one of the power stages is permanently enabled.

7. The amplifier of claim 1, further comprising:
- a driver circuit between the modulation stage and the plurality of power stages configured to provide each of the power stages with a control signal.

8. The amplifier of claim 1, wherein the first and second switches are MOS transistors or bipolar transistors.

9. The amplifier of claim 1, further comprising:
- a loudspeaker connected to the respective outputs of the power stages.

10. An electronic device comprising the amplifier of claim 1.

11. A method of controlling an amplifier comprising: a modulation stage having a first input for receiving an input signal and an output for providing a modulated version of the input signal; a plurality of power stages, each power stage being responsive to said modulation stage and comprising a first switch and a second switch coupled in series between a first voltage source and a second voltage source, each power stage comprising an output node between the first switch and the second switch, the method comprising:
- comparing the input signal level to fractions of a reference signal, wherein each respective fraction corresponds to a different power stage; and
- enabling a selected number of the power stages as a function of the measured input signal level.

12. A method of controlling an amplifier comprising: a modulation stage having a first input for receiving an input signal and an output for providing a modulated version of the input signal; a plurality of power stages, each power stage being responsive to said modulation stage and comprising a first switch and a second switch coupled in series between a first voltage source and a second voltage source, each power stage comprising an output node between the first switch and the second switch, the method comprising:
- measuring the input signal level;
- enabling a selected number of the power stages as a function of the measured input signal level; and
- producing a signal strength indication signal, said producing step comprising:
  - producing the input signal as the signal strength indication signal for an input signal increasing in strength;
  - holding the maximum value of said increasing input signal level; and
  - producing a decaying signal strength indication signal having a predefined decay as a function of the measured maximum value of the input signal level for the input signal level decreasing in intensity.

13. The method of claim 12, further comprising:
- comparing the signal strength indication signal with a plurality of different fractions of a reference signal, each comparison result providing an enable signal for a different subset of power stages.

* * * * *